(12) United States Patent
Seder et al.

(10) Patent No.: US 11,579,340 B2
(45) Date of Patent: Feb. 14, 2023

(54) SELF-CLEANING SYSTEM FOR DISPLAYS USING LIGHT EMITTING DIODES EMITTING INVISIBLE VIOLET LIGHT

(71) Applicant: GM GLOBAL TECHNOLOGY OPERATIONS LLC, Detroit, MI (US)

(72) Inventors: Thomas A. Seder, Fraser, MI (US); James A. Carpenter, Rochester Hills, MI (US); Kai-Han Chang, Madison Heights, MI (US); Gayatri V. Dadheech, Bloomfield Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 254 days.

(21) Appl. No.: 17/094,896

(22) Filed: Nov. 11, 2020

(65) Prior Publication Data

US 2022/0146715 A1    May 12, 2022

(51) Int. Cl.
| | |
|---|---|
| *B01J 35/00* | (2006.01) |
| *B01J 37/34* | (2006.01) |
| *G02B 1/11* | (2015.01) |
| *G02B 1/18* | (2015.01) |
| *H01L 33/44* | (2010.01) |

(52) U.S. Cl.
CPC .............. *G02B 1/18* (2015.01); *B01J 35/004* (2013.01); *B01J 37/34* (2013.01); *G02B 1/11* (2013.01); *H01L 33/44* (2013.01)

(58) Field of Classification Search
CPC .. G02B 1/11; G02B 1/18; B01J 21/063; B01J 35/004; B01J 37/0215; B01J 37/34; H01L 25/0753; H01L 27/15; H01L 25/167; H01L 33/44; H01L 2933/0025

See application file for complete search history.

(56) References Cited

U.S. PATENT DOCUMENTS

| | | |
|---|---|---|
| 9,861,974 B2 | 1/2018 | Dadheech et al. |
| 10,052,622 B2 | 8/2018 | Dadheech et al. |

(Continued)

FOREIGN PATENT DOCUMENTS

JP    2005101458 A  *  4/2005

OTHER PUBLICATIONS

English translation of JP 2005-101458 A (Kawamura et al.) retrieved from https://worldwide.espacenet.com/ on Sep. 26, 2022 (Year: 2005).*

(Continued)

*Primary Examiner* — Ryan S Dunning

(57) ABSTRACT

A system includes a display. The display includes an array of LEDs covered by a transparent material. The array of LEDs includes a plurality of first, second, third, and fourth LEDs respectively configured to emit red, green, blue, and violet light. The red, green, and blue light from the first, second, and third LEDs is visible to human eye. Violet light from the fourth LEDs is invisible to human eye. The system includes a photocatalytic coating disposed on the transparent material. The photocatalytic coating includes a photo-catalyst responsive to ultraviolet radiation present in sunlight and to the violet light emitted by the fourth LEDs in the array of LEDs. The system includes a controller configured to selectively turn on the fourth LEDs to activate the photo-catalyst in the photocatalytic coating disposed on the transparent material.

19 Claims, 6 Drawing Sheets

(56) References Cited

U.S. PATENT DOCUMENTS

| | | | |
|---|---|---|---|
| 10,195,602 B2 | 2/2019 | Dadheech et al. | |
| 10,274,647 B2 | 4/2019 | Seder et al. | |
| 10,429,641 B2 | 10/2019 | Carpenter et al. | |
| 10,486,149 B2 | 11/2019 | Dadheech et al. | |
| 10,533,249 B2 | 1/2020 | Dadheech et al. | |
| 10,556,231 B2 | 2/2020 | Dadheech et al. | |
| 10,569,263 B2 | 2/2020 | Dadheech et al. | |
| 10,583,428 B2 | 3/2020 | Seder et al. | |
| 10,754,067 B2 | 8/2020 | Seder et al. | |
| 2013/0032202 A1* | 2/2013 | Nghiem | C03C 17/3678 428/196 |
| 2019/0337013 A1 | 11/2019 | Dadheech et al. | |
| 2019/0369389 A1 | 12/2019 | Carpenter et al. | |
| 2020/0147598 A1 | 5/2020 | Dadheech et al. | |
| 2021/0369883 A1* | 12/2021 | Danielescu | D06M 11/46 |

OTHER PUBLICATIONS

U.S. Appl. No. 16/410,667, filed May 13, 2019, Seder et al.

* cited by examiner

SELF-CLEANING SYSTEM FOR DISPLAYS USING LIGHT EMITTING DIODES EMITTING INVISIBLE VIOLET LIGHT

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates generally to display systems and more particularly to self-cleaning system for displays using micro-LEDs.

Light emitting diode (LED)-based displays are used in various applications. For example, the LED-based displays are used in computers, mobile devices, televisions, kiosks, teller machines, household appliances, and vehicle dashboards. Many of these LED-based displays include touchscreens. Accordingly, fingerprints, oil residues, and other debris are frequently deposited on surfaces of these displays. The surfaces of these displays need to be cleaned to eliminate the fingerprints, oil residues, and other debris from the surfaces of these displays.

SUMMARY

A system comprises a display comprising an array of LEDs covered by a transparent material and including a plurality of first, second, third, and fourth LEDs respectively configured to emit red, green, blue, and violet light. The red, green, and blue light from the first, second, and third LEDs is visible to human eye. Violet light from the fourth LEDs is invisible to human eye. The system comprises a photocatalytic coating disposed on the transparent material. The photocatalytic coating includes a photo-catalyst responsive to ultraviolet radiation present in sunlight and to the violet light emitted by the fourth LEDs in the array of LEDs. The system comprises a controller configured to selectively turn on the fourth LEDs to activate the photo-catalyst in the photocatalytic coating disposed on the transparent material.

In another feature, the activation of the photo-catalyst cleans an outer surface of the photocatalytic coating.

In another feature, the photo-catalyst includes an oxide of a first metal, and the oxide is doped with a second metal that is different than the first metal in the oxide. Alternatively, the photo-catalyst includes an oxide of a metal, and the oxide is doped with a non-metal.

In another feature, the controller is configured to turn on the fourth LEDs in response to an amount of sunlight around the display being less than or equal to a predetermined threshold.

In another feature, the controller is configured to turn on the fourth LEDs in response in the presence of sunlight around the display.

In another feature, a vehicle comprises the system, and the controller is configured to turn on the fourth LEDs in response to the vehicle being turned on.

In another feature, a vehicle comprises the system, and the controller is configured to turn on the fourth LEDs for a predetermined time period in response to the vehicle being turned off, and to turn off the fourth LEDs after the predetermined time period elapses.

In another feature, a vehicle comprises the system, and the controller is configured to turn on the fourth LEDs in response to an amount of sunlight around the display being less than or equal to a predetermined threshold.

In another feature, a vehicle comprises the system, and the controller is configured to turn on the fourth LEDs in the presence of sunlight around the display.

In another feature, the display comprises an anti-reflective coating disposed on the transparent material, and the photocatalytic coating is disposed on the antireflective coating.

In still other features, a method comprises arranging, in an array of LEDs comprising first, second, and third LEDs respectively emitting red, green, and blue light visible to human eye, a plurality of fourth LEDs between pairs of the first and second LEDs and between pairs of the third LEDs, the fourth LEDs emitting violet light invisible to human eye. The method comprises covering the array by a transparent material, and disposing on the transparent material a photocatalytic coating including a photo-catalyst responsive to ultraviolet radiation present in sunlight and to the violet light emitted by the fourth LEDs in the array of LEDs. The method comprises selectively turning on the fourth LEDs to activate the photo-catalyst in the photocatalytic coating disposed on the transparent material.

In another feature, the activation of the photo-catalyst cleans an outer surface of the photocatalytic coating.

In another feature, the photo-catalyst includes an oxide of a first metal, and the oxide is doped with a second metal that is different than the first metal in the oxide. Alternatively, the photo-catalyst includes an oxide of a metal, and the oxide is doped with a non-metal.

In another feature, the method further comprises turning on the fourth LEDs in response to an amount of sunlight around the array being less than or equal to a predetermined threshold.

In another feature, the method further comprises turning on the fourth LEDs in response in the presence of sunlight around the array.

In another feature, the array is arranged in a vehicle, and the method further comprises turning on the fourth LEDs in response to the vehicle being turned on.

In another feature, the array is arranged in a vehicle, and the method further comprises turning on the fourth LEDs for a predetermined time period in response to the vehicle being turned off, and turning off the fourth LEDs after the predetermined time period elapses.

In another feature, the array is arranged in a vehicle, and the method further comprises turning on the fourth LEDs in response to an amount of sunlight around the array being less than or equal to a predetermined threshold.

In another feature, the array is arranged in a vehicle, and the method further comprises turning on the fourth LEDs in the presence of sunlight around the array.

In another feature, the method further comprises disposing an antireflective coating on the transparent material, and the photocatalytic coating is disposed on the antireflective coating.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
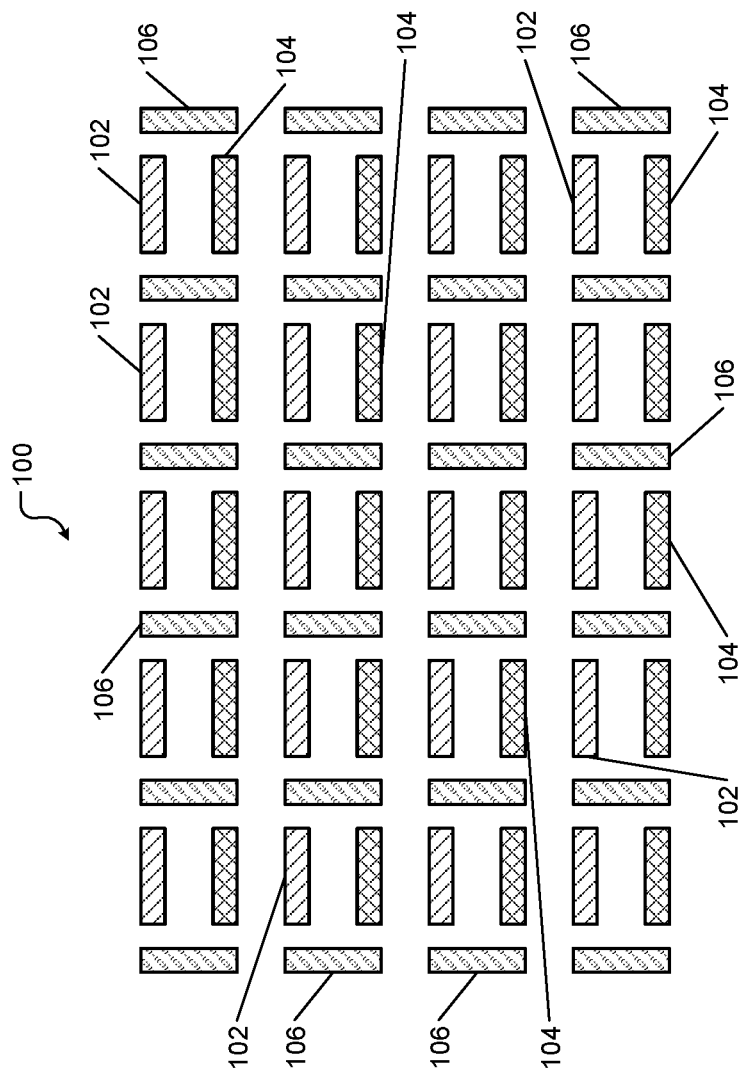
FIG. 1 shows an example of an array of red, green, and blue LEDs.

Surfaces of some LED-based displays are coated with photocatalytic coatings that decompose and eliminate materials such as fingerprints, oil residues, and other debris from the surfaces of the displays when the photocatalytic coatings are activated by light (e.g., ultraviolet radiation from sunlight). A photocatalytic coating includes a photo-catalyst that is energized by light. The excitation of the photo-catalyst by light causes chemical reactions at the surface of the photo-catalytic coating, which utilizes water molecules in the air to clean the surface of the photocatalytic coating. The photo-catalytic coatings are transparent and are designed for use with a wide variety of surfaces including LED-based displays.

The photocatalytic coatings typically incorporate materials (e.g., $TiO_2$) having a band gap in the ultraviolet (UV) and near-UV portion of the light spectrum. Accordingly, these photocatalytic coatings can be activated by UV radiation present in sunlight. However, these photocatalytic coatings do not work effectively at night or in sunless conditions such as cloudy days and in vehicles having tinted windows (i.e., when the amount of sunlight is less than or equal to a predetermined threshold). Expensive and cumbersome UV illuminators are needed for the photocatalytic coatings to work in such situations.

The present disclosure provides a system that allows photocatalytic coatings to work at night and in sunless conditions (i.e., when the amount of sunlight is less than or equal to a predetermined threshold). The system incorporates violet micro-LEDs into an array of red, green, and blue (RGB) micro-LEDs of an LED-based display to provide photons that initiate photo-catalysis of water and removal of fingerprint oils and other debris from the photocatalytic coating on the display. Unlike the red, green, and blue light generated by the red, green, and blue micro-LEDs, which is visible to human eye, the violet micro-LEDs produce violet light that is different than ultraviolet radiation and that is invisible to human eye but is absorbed by the photo-catalyst in the photocatalytic coating.

The photo-catalyst includes a metal oxide or a doped metal oxide with bandgap tuned to the violet light produced by the violet micro-LEDs. Specifically, the photo-catalyst includes an oxide of a first metal, and the oxide is doped with a second metal (or a non-metal) that is different than the first metal in the oxide. Examples of the photo-catalyst include anatase, which is a metastable mineral form of $TiO_2$, and metal-doped versions of anatase. Examples of the metals used for doping the metal oxide include any of the transition metals listed in the d-block of the periodic table. Examples of non-metals that can be used as dopants to tune the bandgap include nitrogen, fluorine etc.

The doping shifts the bandgap of the metal oxide such that the photo-catalyst is activated not only by the ultraviolet radiation from the sunlight but is also activated by the violet light produced by the violet micro-LEDs. This feature allows activating the photo-catalyst using the violet light produced by the violet micro-LEDs and self-cleaning the surfaces of the LED-based displays in the absence of sunlight (e.g., at night, on cloudy days, in vehicles having tinted windows, etc.). These and other features of the present disclosure are described below in further detail.

FIG. 1 shows a micro-LED array 100 including red, green, and blue (RGB) micro-LEDs of an LED-based display. The red, green, and blue (RGB) micro-LEDs are respectively shown by reference numerals 102, 104, and 106. While not shown, the micro-LED array 100 is manufactured on a silicon substrate and is covered with glass or other transparent material, which is coated with a photocatalytic coating, which is also transparent. The photocatalytic coating includes a photo-catalyst (e.g., $TiO_2$) that requires UV light for activation.

Figure 2:
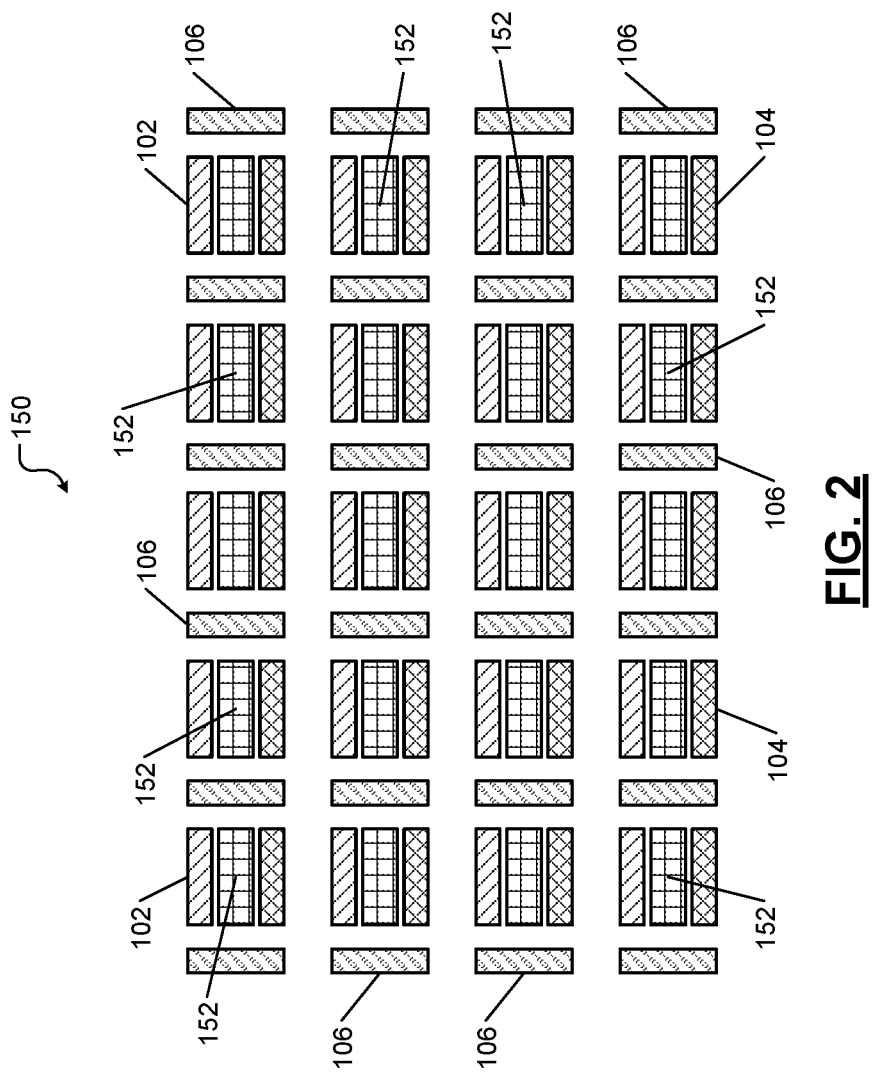
FIG. 2 shows an example of the array of red, green, and blue LEDs of FIG. 1 with the addition of violet LEDs disposed between the red, green, and blue LEDs.

FIG. 2 shows a micro-LED array 150 of an LED-based display according to the present disclosure. The micro-LED array 150 includes the red, green, and blue, (RGB) micro-LEDs 102, 104, and 106. Additionally, the micro-LED array 150 includes violet micro-LEDs 152 that are arranged between the RGB micro-LEDs 102, 104, 106 as shown. For example, a violet micro-LED 152 is disposed between every pair of red and green micro-LEDs 102, 104. Additionally, a violet micro-LED 152 is disposed between every pair of blue micro-LEDs 106. Accordingly, the micro-LED array 150 is called the RGBV micro-LED array 150 comprising the RGBV micro-LEDs 102, 104, 106, 152.

As explained below with reference to FIGS. 3-5, the micro-LED array 150 is manufactured on a silicon substrate and is covered with glass or other transparent material, which is coated with a photocatalytic coating. The photo-catalytic coating, which is also transparent, includes a photo-catalyst. The photo-catalyst includes a metal oxide or a doped metal oxide with bandgap tuned to violet light emitted by the violet micro-LEDs 152. Examples of the photo-catalyst include anatase and metal-doped versions of anatase. Alternatively, non-metals such as nitrogen, fluorine etc. can be used as dopants to tune the bandgap of anatase. The photo-catalyst works with UV light present in sunlight and works with the violet light emitted by the violet micro-LEDs 152.

Figure 3:
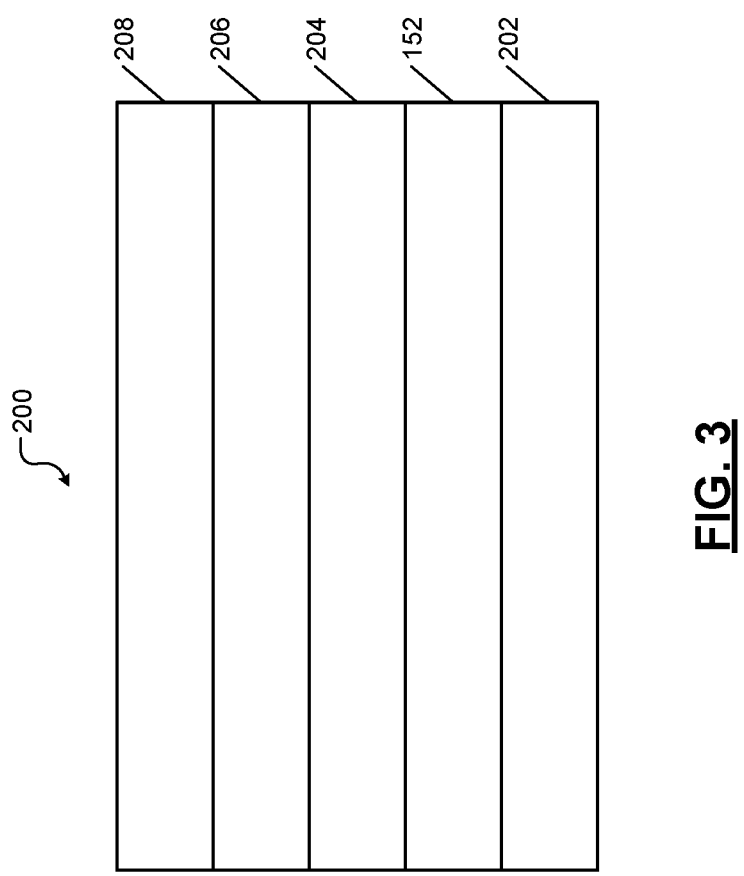
FIG. 3 shows an example of a cross-section of a display that uses the array of red, green, blue, and violet LEDs of FIG. 2 with a photocatalytic coating disposed on the display.

FIG. 3 shows an example of a cross-section of an LED-based display 200 according to the present disclosure. The elements shown in FIG. 3 are not drawn to scale. The LED-based display 200 comprises a substrate (e.g., a silicon substrate) 202. The substrate 202 comprises circuits and power and control lines used to control the RGBV micro-LEDs 102, 104, 106, 152 of the micro-LED array 150. The micro-LED array 150 is arranged on the substrate 202. The RGBV micro-LEDs 102, 104, 106, 152 of the micro-LED array 150 are connected to the circuits and power and control lines in the substrate 202 using vias (not shown). The micro-LED array 150 is shown in further detail in FIG. 4. An example of a controller to control the micro-LED array 150 is shown in FIG. 5.

A cover 204 of glass or other transparent material is arranged on the micro-LED array 150. An outer surface of the cover 204 may be optionally coated with a coating of an antireflective material 206 (hereinafter antireflective coating 206). A coating of a photocatalytic material 208 (hereinafter photocatalytic coating 208) is applied on top of the antireflective coating 206 (or on the outer surface of the cover 204 if the antireflective coating 206 is omitted).

The photocatalytic coating 208 includes a photo-catalyst comprising a metal oxide or a doped metal oxide with bandgap tuned to the violet light produced by the violet micro-LEDs 152 of the micro-LED array 150. Specifically, the photo-catalyst includes an oxide of a first metal, and the oxide is doped with a second metal (or a non-metal) that is different than the first metal in the oxide. Examples of the photo-catalyst include anatase, which is a metastable mineral form of $TiO_2$, and metal-doped versions of anatase. Examples of the metals used for doping the metal oxide include any of the transition metals listed in the d-block of the periodic table. Alternatively, non-metals such as nitrogen, fluorine etc. can be used as dopants.

The doping shifts the bandgap of the metal oxide such that the photo-catalyst is activated not only by the ultraviolet radiation from the sunlight but is also activated by the violet light produced by the violet micro-LEDs 152 of the micro-LED array 150. Since the photo-catalyst works with UV light present in sunlight and with the violet light emitted by the violet micro-LEDs 152, the self-cleaning of the outer surface of the photocatalytic coating 208 can be initiated by turning on the violet micro-LEDs 152 of the micro-LED array 150 in the absence of sunlight (e.g., at night, on cloudy days, in vehicles having tinted windows, etc.).

Figure 4:
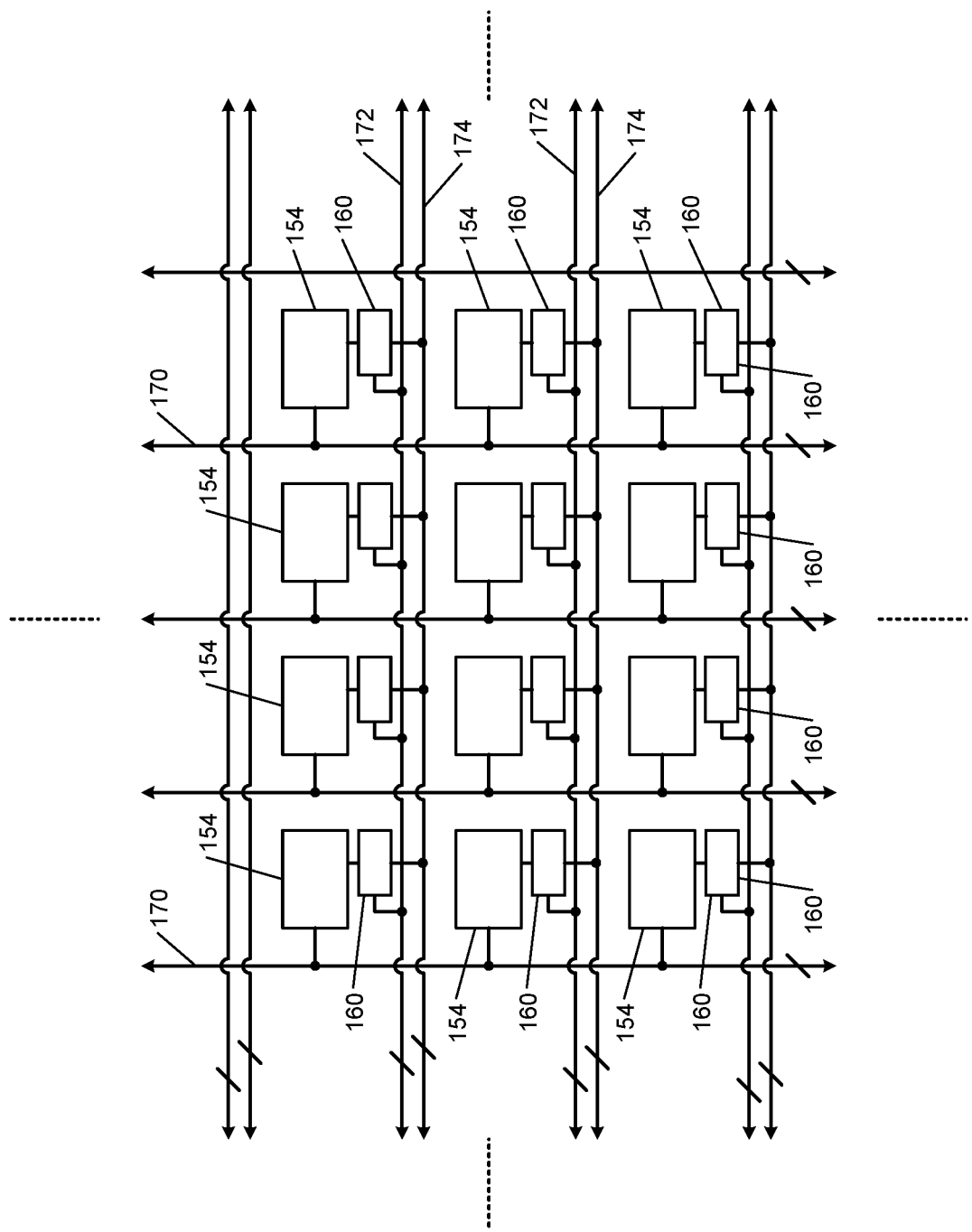
FIG. 4 shows the array of red, green, blue, and violet LEDs of FIG. 2 in further detail.

FIG. 4 shows the micro-LED array 150 comprising the RGBV micro-LEDs 102, 104, 106, 152. The RGBV micro-LEDs 102, 104, 106, 152 are not shown as separate elements in FIG. 4 but are shown as separate elements in FIG. 5. Instead, each set of RGBV micro-LEDs 102, 104, 106, 152 is collectively shown in FIG. 4 as element 154. In other words, each element 154 shown in FIG. 4 includes one each of the RGBV micro-LEDs 102, 104, 106, 152.

The micro-LED array 150 comprises a plurality of sets of switches (shown as Sws) 160 connected to the RGBV micro-LEDs 102, 104, 106, 152 (i.e., to the elements 154). Each set of switches 160 is connected a respective set of RGBV micro-LEDs 102, 104, 106, 152 (i.e., to one of the elements 154). Each set of switches 160 includes four switches (shown in FIG. 5) that are respectively connected to the individual RGBV micro-LEDs 102, 104, 106, 152 in one of the elements 154. Again, the four switches in the sets of switches 160 are not shown as separate elements in FIG. 4 but are shown as separate elements in FIG. 5.

The micro-LED array 150 further comprises a plurality of power supply lines 170, a plurality of power return lines 172, and a plurality of control lines 174. For Example, the power supply lines 170 may be connected to first ends of the RGBV micro-LEDs 102, 104, 106, 152. The power return lines 172 may be connected to second ends of the RGBV micro-LEDs 102, 104, 106, 152 via respective switches 160. The control lines 174 may be connected to control terminals of the switches 160 (e.g., to gates of transistors used as switches 160). As described below with reference to FIG. 5, a controller can control the switches and selectively turn on and off any of the RGBV micro-LEDs 102, 104, 106, 152 in the micro-LED array 150.

Figure 5:
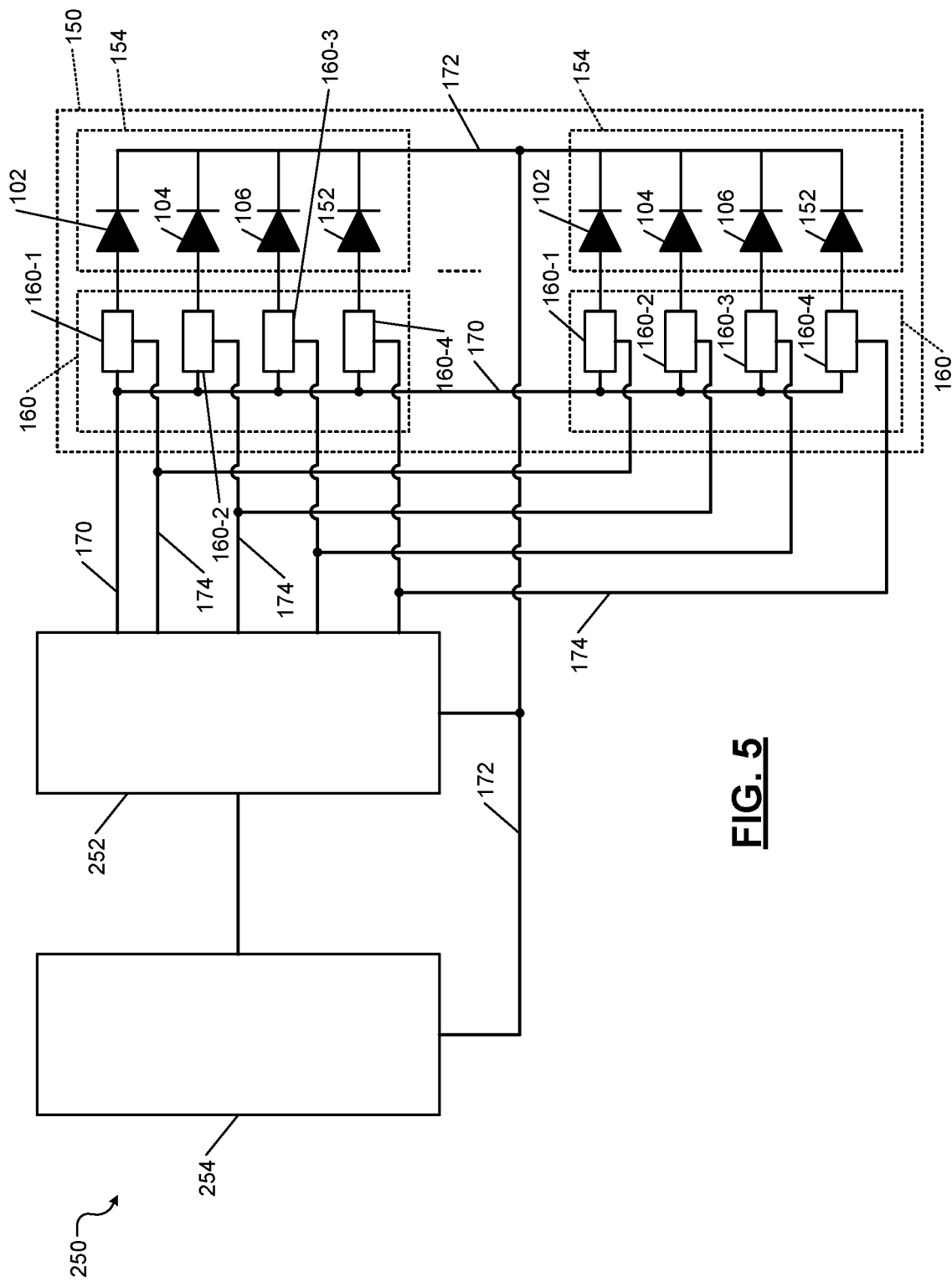
FIG. 5 shows a system comprising the array of red, green, blue, and violet LEDs of FIG. 2, a controller, and a power supply.

FIG. 5 shows a block diagram of a system 250 comprising the micro-LED array 150, a display controller 252, and a power supply (e.g., a battery of a vehicle) 254. Each set of switches 160 includes four switches 160-1, 160-2, 160-3, 160-4 (collectives the switches 160). The controller 252 controls the switches 160 to turn on and off any of the RGBV micro-LEDs 102, 104, 106, 152 in the micro-LED array 150. For example, to perform the cleaning process described above, the controller 252 can turn on all of the violet micro-LEDs 152 by controlling the switches 160-4 whenever the vehicle is turned on. Alternatively, the controller 252 can turn on all of the violet micro-LEDs 152 for a predetermined time period (e.g., 4 hours) by controlling the switches 160-4 whenever the vehicle is turned off. Alternatively, the controller 252 can turn on all of the violet micro-LEDs 152 by controlling the switches 160-4 whenever a sensor in the vehicle detects that the amount of sunlight around the display is less than or equal to a threshold (e.g., when surroundings of the vehicle are darker than the threshold).

The violet light from the violet micro-LEDs 152 activates the photocatalytic coating 208 on the cover 204 of the display 200. The violet light from the violet micro-LEDs 152 initiates the chemical reactions on the surface of the photocatalytic coating 208. The chemical reactions clean the surface of the photocatalytic coating 208. Accordingly, the cleaning process can occur in the presence of sunlight since the UV radiation in the sunlight can activate the photocatalytic coating 208 on the cover 204 of the display 200. Additionally, in the absence of sunlight, the cleaning process can be initiated by turning on violet micro-LEDs 152 since the violet light from the violet micro-LEDs 152 can activate the photocatalytic coating 208 on the cover 204 of the display 200.

In some implementations, the controller 252 can turn on only some and not all of the violet micro-LEDs 152. For example, the controller 252 can turn on only alternate ones of the violet micro-LEDs 152. Other patterns may be used. Further, the controller 252 can control the intensity of the violet micro-LEDs 152 by controlling the current supplied to the violet micro-LEDs 152. The controller 252 can control at least one of the intensity and the pattern of the turned on violet micro-LEDs 152 depending on factors such as the amount of sunlight present around the display 200. The controller 252 can control both the intensity and the pattern of the turned on violet micro-LEDs 152 together (i.e., in tandem) to effectively achieve the cleaning.

Figure 6:
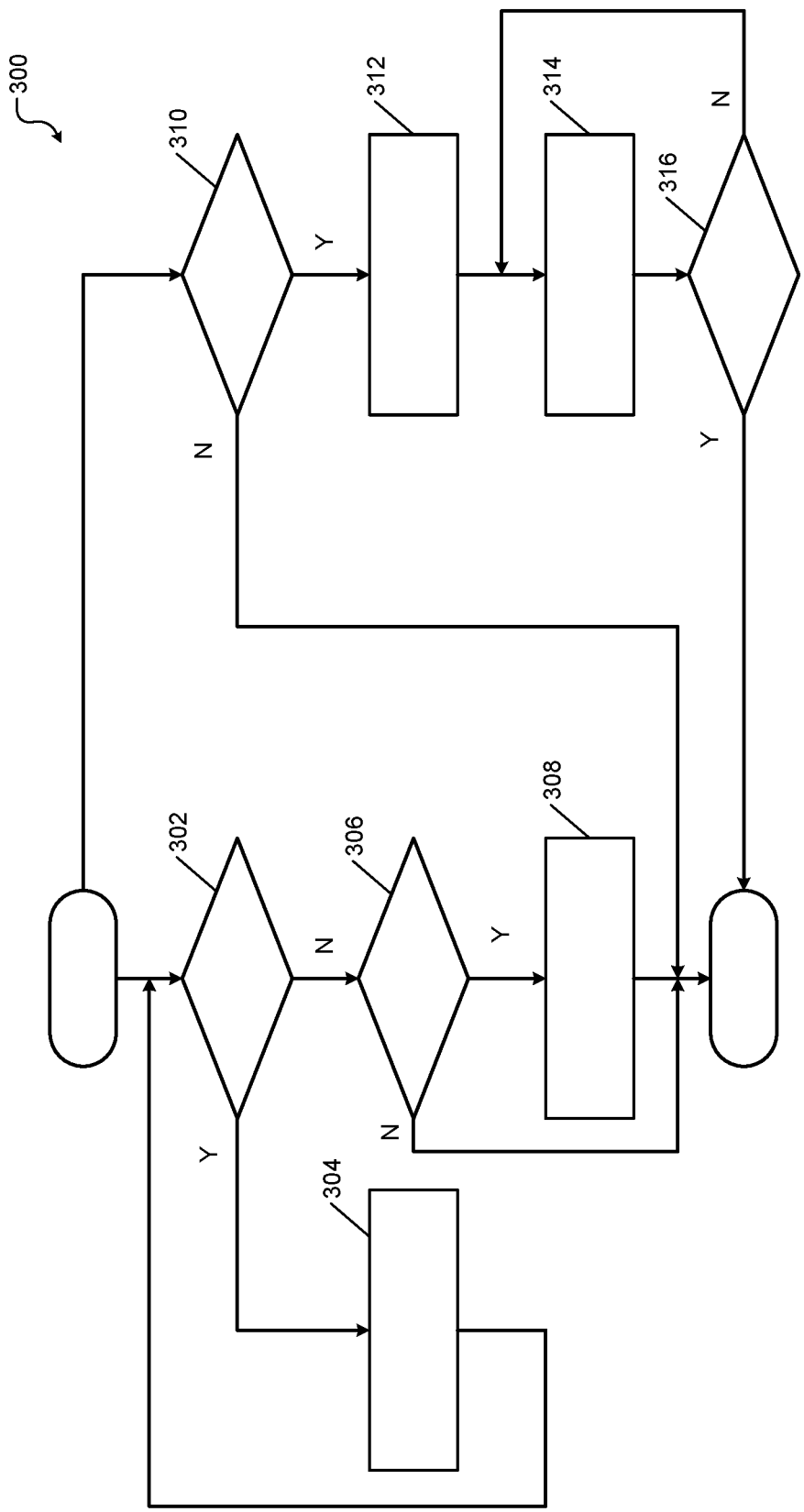
FIG. 6 shows a method of controlling the array of red, green, blue, and violet LEDs of FIG. 2 using the controller and the power supply of FIG. 5.

FIG. 6 shows a flowchart of a method 300 performed by the controller 252. In the following description, the term control refers to the operations performed by the controller 252. At 302, control determines whether the vehicle is turned on. If the vehicle is turned on, at 304, control turns on the violet micro-LEDs 152, and control returns to 302. If the vehicle is not turned on, at 306, control determines if the surroundings of the vehicle are dark (i.e., if the amount of sunlight surrounding the display is less than or equal to a predetermined threshold; e.g., if there is not sufficient sunlight to activate the photo-catalyst in the photocatalytic coating 208). Control ends if the surroundings of the vehicle are not dark (i.e., if the amount of sunlight surrounding the display is greater than or equal to a predetermined threshold; e.g., if there is sufficient sunlight to activate the photo-catalyst in the photocatalytic coating 208).

If the surroundings of the vehicle are dark (i.e., if the amount of sunlight surrounding the display is less than or equal to a predetermined threshold; e.g., if there is not sufficient sunlight to activate the photo-catalyst in the photocatalytic coating 208), control proceeds to 308. At 308, control turns on the violet micro-LEDs 152 at full intensity for a predetermined period (e.g., for up to four hours or an amount of time empirically determined to be sufficient for cleaning the surface of the photocatalytic coating 208). Control ends when the predetermined time period elapses.

Alternatively, instead of starting at 302, control begins at 310. At 310, control determines whether a cleaning mode is activated (e.g., by the vehicle owner). Control ends if the cleaning mode is not activated. If the cleaning mode is activated, at 312, control turns on the violet micro-LEDs 152 while the vehicle is turned on. At 314, control turns on the violet micro-LEDs 152 for a predetermined period (e.g., for up to four hours or an amount of time empirically determined to be sufficient for cleaning the surface of the photocatalytic coating 208). At 316, control determines if the predetermined time period has elapsed. Control ends when the predetermined time period elapses.

The teachings of the present disclosure are not limited to LED-based displays used in vehicles. Rather, the teachings are applicable to LED-based displays used in other devices such as computers, mobile devices, televisions, kiosks, teller machines, and household appliances. The teachings can be used in these other devices so long as the LED-based displays include the photocatalytic coating according to the present disclosure and a source of power is available to turn on the violet micro-LEDs incorporated in the LED-based displays according to the present disclosure.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims.

It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "controller" may be replaced with the term "circuit." The term "controller" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The term code, as used above, may include software, firmware, and/or microcode, and may refer to programs, routines, functions, classes, data structures, and/or objects. The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C #, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP:

Hypertext Preprocessor), Scala, Eiffel, Smalltalk, Erlang, Ruby, Flash®, Visual Basic®, Lua, MATLAB, SIMULINK, and Python®.

What is claimed is:

1. A system comprising:
a display comprising an array of LEDs covered by a transparent material and including a plurality of first, second, third, and fourth LEDs respectively configured to emit red, green, blue, and violet light; wherein the red, green, and blue light from the first, second, and third LEDs is visible to human eye; and wherein violet light from the fourth LEDs is invisible to human eye;
a photocatalytic coating disposed on the transparent material, the photocatalytic coating including a photo-catalyst responsive to ultraviolet radiation present in sunlight and to the violet light emitted by the fourth LEDs in the array of LEDs; and
a controller configured to selectively turn on the fourth LEDs to activate the photo-catalyst in the photocatalytic coating disposed on the transparent material,
wherein the controller is configured to turn on the fourth LEDs in response to an amount of sunlight around the display being less than or equal to a predetermined threshold.

2. The system of claim 1 wherein the activation of the photo-catalyst cleans an outer surface of the photocatalytic coating.

3. The system of claim 1 wherein:
the photo-catalyst includes an oxide of a first metal and wherein the oxide is doped with a second metal that is different than the first metal in the oxide; or
the photo-catalyst includes an oxide of a metal and wherein the oxide is doped with a non-metal.

4. The system of claim 1 wherein the controller is further configured to turn on the fourth LEDs in response in the presence of sunlight around the display.

5. A vehicle comprising the system of claim 1 wherein the controller is further configured to turn on the fourth LEDs in response to the vehicle being turned on.

6. A vehicle comprising the system of claim 1 wherein the controller is further configured to:
turn on the fourth LEDs for a predetermined time period in response to the vehicle being turned off; and
turn off the fourth LEDs after the predetermined time period elapses.

7. A vehicle comprising the system of claim 1.

8. A vehicle comprising the system of claim 1 wherein the controller is further configured to turn on the fourth LEDs in the presence of sunlight around the display.

9. The system of claim 1 wherein the display further comprises an antireflective coating disposed on the transparent material and wherein the photocatalytic coating is disposed on the antireflective coating.

10. A method comprising:
arranging, in an array of LEDs comprising first, second, and third LEDs respectively emitting red, green, and blue light visible to human eye, a plurality of fourth LEDs between pairs of the first and second LEDs and between pairs of the third LEDs, the fourth LEDs emitting violet light invisible to human eye;
covering the array by a transparent material;
disposing on the transparent material a photocatalytic coating including a photo-catalyst responsive to ultraviolet radiation present in sunlight and to the violet light emitted by the fourth LEDs in the array of LEDs;
selectively turning on the fourth LEDs to activate the photo-catalyst in the photocatalytic coating disposed on the transparent material; and
wherein the array is arranged in a vehicle, the method further comprising turning on the fourth LEDs in response to the vehicle being turned on.

11. The method of claim 10 wherein the activation of the photo-catalyst cleans an outer surface of the photocatalytic coating.

12. The method of claim 10 wherein:
the photo-catalyst includes an oxide of a first metal and wherein the oxide is doped with a second metal that is different than the first metal in the oxide; or
the photo-catalyst includes an oxide of a metal and wherein the oxide is doped with a non-metal.

13. The method of claim 10 further comprising turning on the fourth LEDs in response to an amount of sunlight around the array being less than or equal to a predetermined threshold.

14. The method of claim 10 wherein the array is arranged in a vehicle, the method further comprising:
turning on the fourth LEDs for a predetermined time period in response to the vehicle being turned off; and
turning off the fourth LEDs after the predetermined time period elapses.

15. The method of claim 10 wherein the array is arranged in a vehicle, the method further comprising turning on the fourth LEDs in response to an amount of sunlight around the array being less than or equal to a predetermined threshold.

16. The method of claim 10 wherein the array is arranged in a vehicle.

17. The method of claim 10 further comprising disposing an antireflective coating on the transparent material, wherein the photocatalytic coating is disposed on the antireflective coating.

18. The method of claim 10 further comprising turning on the fourth LEDs in response in the presence of sunlight around the array.

19. A method comprising:
arranging, in an array of LEDs comprising first, second, and third LEDs respectively emitting red, green, and blue light visible to human eye, a plurality of fourth LEDs between pairs of the first and second LEDs and between pairs of the third LEDs, the fourth LEDs emitting violet light invisible to human eye;
covering the array by a transparent material;
disposing on the transparent material a photocatalytic coating including a photo-catalyst responsive to ultraviolet radiation present in sunlight and to the violet light emitted by the fourth LEDs in the array of LEDs;
selectively turning on the fourth LEDs to activate the photo-catalyst in the photocatalytic coating disposed on the transparent material,
wherein the array is arranged in a vehicle;
turning on the fourth LEDs for a predetermined time period in response to the vehicle being turned off; and
turning off the fourth LEDs after the predetermined time period elapses.

* * * * *